(12) United States Patent
Hsuan et al.

(10) Patent No.: US 7,659,501 B2
(45) Date of Patent: Feb. 9, 2010

(54) IMAGE-SENSING MODULE OF IMAGE CAPTURE APPARATUS AND MANUFACTURING METHOD THEREOF

(75) Inventors: Min-Chih Hsuan, Hsinchu (TW); Tsung-Hsi Ko, Hsinchu (TW); Li-Che Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/693,743

(22) Filed: Mar. 30, 2007

(65) Prior Publication Data

US 2008/0239120 A1    Oct. 2, 2008

(51) Int. Cl.
*H01J 3/14* (2006.01)
*H01J 5/16* (2006.01)

(52) U.S. Cl. .................. 250/216; 250/208.1; 257/432; 348/340

(58) Field of Classification Search ............. 250/208.1, 250/214.1, 214 R, 216, 226; 359/619–626; 257/65, 294, 431, 432, 439; 348/340
See application file for complete search history.

(56) References Cited

U.S. PATENT DOCUMENTS

| 6,822,803 | B2 | 11/2004 | Muto et al. | |
|---|---|---|---|---|
| 6,891,592 | B2 | 5/2005 | Magana et al. | |
| 2001/0033007 | A1* | 10/2001 | Lee | 257/432 |
| 2002/0089596 | A1* | 7/2002 | Suda | 348/302 |
| 2003/0025825 | A1* | 2/2003 | Nakajoh | 348/374 |
| 2005/0029433 | A1* | 2/2005 | Sakoh et al. | 250/208.1 |
| 2005/0041134 | A1* | 2/2005 | Takayama | 348/340 |
| 2006/0043260 | A1* | 3/2006 | Ma et al. | 250/208.1 |
| 2007/0145242 | A1* | 6/2007 | Toyoda et al. | 250/208.1 |

* cited by examiner

*Primary Examiner*—Georgia Y Epps
*Assistant Examiner*—Francis M Legasse, Jr.
(74) *Attorney, Agent, or Firm*—Jianq Chyun IP Office

(57) ABSTRACT

An image-sensing module is provided. The image-sensing module includes a substrate, a plurality of image-sensing units, a plurality of micro lenses and a focusing unit. The image-sensing units are disposed on the substrate and the micro lenses are respectively disposed on one of the image-sensing units. The focusing unit is disposed on the substrate and covers the micro lenses. A top surface of the focusing unit is a curved surface. Furthermore, a method of manufacturing the image-sensing module and an image capture apparatus are provided.

35 Claims, 11 Drawing Sheets

IMAGE-SENSING MODULE OF IMAGE CAPTURE APPARATUS AND MANUFACTURING METHOD THEREOF

BACKGROUND OF THE INVENTION

1. Field of the Invention

The present invention relates to an image-sensing module, and more particularly, to an image-sensing module with a focusing unit and a manufacturing method thereof, and an image capture apparatus with the image-sensing module.

2. Description of Related Art

The process of fabricating complementary metal-oxide-semiconductor (CMOS) image sensor and CMOS transistor are compatible. Therefore, image sensors along with other peripheral circuits can be easily integrated on the same chip to reduce overall production cost and power consumption. In recent years, CMOS image sensors are widely adopted in low-end applications and frequently serve as a replacement for charge-coupled devices. Consequently, the importance of CMOS image sensors is increasing every day.

FIG. 1A is a schematic diagram of a conventional CMOS image sensor, and FIG. 1B is an explosion view showing the components of the CMOS image sensor in FIG. 1A. As shown in FIGS. 1A and 1B, the conventional CMOS image sensor 100 includes a base 110, a CMOS chip 120 and a lens group 130. The CMOS chip 120 and the lens group 130 are disposed on the base 110 and the lens group 130 covers the CMOS chip 120. The lens group 130 includes a lens mount 132, a plurality of lenses 134, an infrared filter 136 and a lens barrel 138. The lens mount 132 is fixed on the base 110 and the lenses 134 are disposed inside the lens barrel 138. The lens barrel 138 is fixed on the base 110 and the infrared filter 136 is disposed between the lenses 134 and the bottom of the base 110.

The lens barrel 138 has a pinhole 139 so that light rays from the exterior can pass through the pinhole 139 to reach the lens group 130. The lenses 134 focus the light rays onto a sensing area 122 of the CMOS chip 120 and the CMOS chip 120 detects the light falling on it. The infrared filter 136 filters the infrared portion of the incoming light rays to prevent the CMOS chip 120 from overheating. Hence, the life of the CMOS chip 120 is increased.

In the conventional technique, the lens group 130 includes a large number of components so that the material cost is high and the assembling time is long. As a result, the conventional CMOS image-sensing module 100 not only has a high production cost but is also too bulky to use in small electronic products such as a cell phone or a pinhole camera.

SUMMARY OF THE INVENTION

Accordingly, at least one objective of the present invention is to provide an image-sensing module with a smaller volume and a lower production cost.

At least another objective of the present invention is to provide a method of manufacturing an image-sensing module capable of increasing the productivity of the image-sensing module.

Yet another objective of the present invention is to provide an image capture apparatus with zoom function.

To achieve these and other advantages and in accordance with the purpose of the invention, as embodied and broadly described herein, the invention provides an image-sensing module including a substrate, a plurality of image-sensing units, a plurality of micro lenses and a focusing unit. The image-sensing units are disposed on the substrate and the micro lenses are respectively disposed on one of the image-sensing units. The focusing unit is disposed on the substrate and covers the micro lenses. A top surface of the focusing unit is a curved surface.

In one embodiment of the present invention, the foregoing focusing unit includes a lens.

In one embodiment of the present invention, the foregoing lens has a refractive index between 1 to 2.

In one embodiment of the present invention, the foregoing lens has a refractive index between 1.4 to 1.8.

In one embodiment of the present invention, the foregoing focusing unit includes a stack of lenses on the substrate.

In one embodiment of the present invention, the foregoing lenses have different refractive indexes.

In one embodiment of the present invention, the lens closer to the substrate has a larger refractive index.

In one embodiment of the present invention, the foregoing image-sensing module further includes an edge wall disposed on the substrate and surrounding the image-sensing units. The focusing unit is disposed within the area enclosed by the edge wall.

In one embodiment of the present invention, the image-sensing module further includes a light-shielding layer disposed on a top surface of the edge wall.

In one embodiment of the present invention, the image-sensing module further includes a frame connected to the edge of the substrate and surrounding the substrate and the focusing unit. The frame has a light-shielding section extending toward the top surface of the focusing unit.

In one embodiment of the present invention, the image-sensing module further includes a frame connected to the edge of the substrate and surrounding the substrate. The frame has a top section above the focusing unit and blocking the focusing unit, and the top section has a pinhole that allows the passage of external light rays to the focusing unit.

In one embodiment of the present invention, the image-sensing module further includes a light-shielding element disposed above the focusing unit to block the focusing unit. The light-shielding element has a pinhole that allows the passage of external light rays to the focusing unit.

The present invention also provides a method of manufacturing an image-sensing module including the following steps. First, a substrate is provided, wherein a plurality of image-sensing units is disposed thereon and each image-sensing unit is covered by a micro lens. Then, a focusing unit that covers the micro lenses is formed on the substrate, wherein the top surface of the focusing unit is a curved surface.

In one embodiment of the present invention, the method of forming the focusing unit includes forming a lens on the substrate, for example.

In one embodiment of the present invention, the method of forming the lens includes performing a thermal curing process or a press molding process, for example.

In one embodiment of the present invention, the method of forming the focusing unit includes stacking a plurality of lenses in sequence on the substrate.

In one embodiment of the present invention, the method of forming the lenses includes performing a thermal curing process or a press molding process.

In one embodiment of the present invention further includes forming an edge wall surrounding the image-sensing units before forming the focusing unit, and the focusing unit is formed inside the area enclosed by the edge wall.

In one embodiment of the present invention, the method of manufacturing the image-sensing module further includes forming a light-shielding layer on the top surface of the edge wall.

In one embodiment of the present invention, the method of manufacturing the image-sensing module further includes connecting a frame to the edge of the substrate, wherein the frame surrounds the substrate and the focusing unit. Furthermore, the frame has a light-shielding section that extends toward the top surface of the focusing unit.

In one embodiment of the present invention, the method of manufacturing the image-sensing module further includes connecting a frame to the edge of the substrate, wherein the frame surrounds the substrate. Furthermore, the frame has a top section above the focusing unit and blocking the focusing unit. The top section has a pinhole that allows the passage of external light rays to the focusing unit.

The present invention also provides an image capture apparatus that includes a base, at least one of the aforementioned image-sensing module and a light-shielding element. The light-shielding element is disposed over the image-sensing module. Furthermore, the light-shielding element has a pinhole that allows the passage of external light rays to the focusing unit.

In one embodiment of the present invention, the foregoing image capture apparatus has a multiple of image-sensing module and the focusing units of the image-sensing modules have different focal distance.

In one embodiment of the present invention, the base is a movable base and the base is suitable for switching the locations of the image-sensing modules so that one of the image-sensing modules is opposite to the pinhole.

In one embodiment of the present invention, the base is a turntable.

Accordingly, the focusing unit in the present invention has a simple structure, occupies a small volume and costs less to produce. Therefore, the design is able to reduce the volume of the image-sensing module and lower its overall production cost. In addition, the focusing unit of the image-sensing module is directly formed on the substrate. Hence, assembling time is saved so that the productivity is increased. Furthermore, the focusing units of the image-sensing modules of the image capture apparatus have different focal distance. Therefore, by switching the image-sensing modules using the base, the zoom function is achieved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
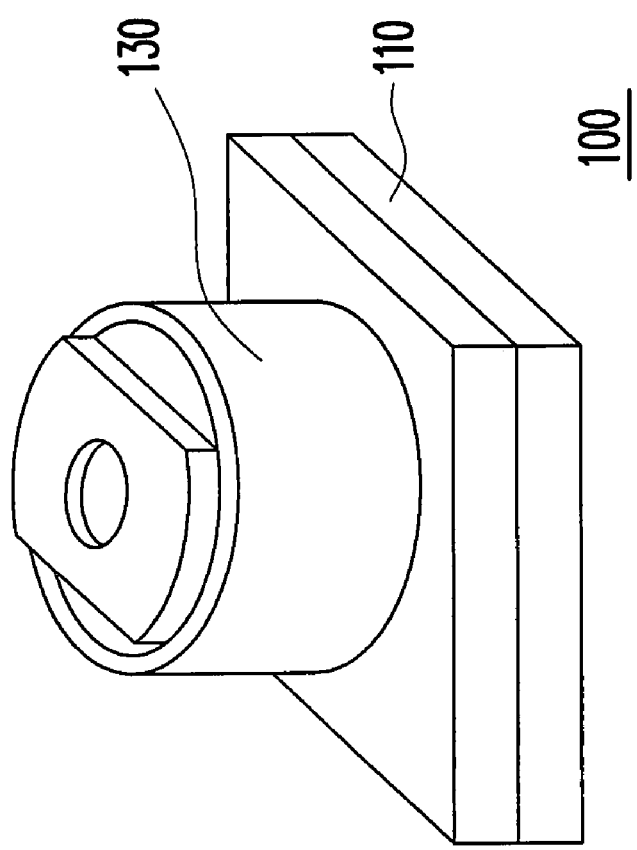
FIG. 1A is a schematic diagram of a conventional CMOS image sensor.
Figure 1B:
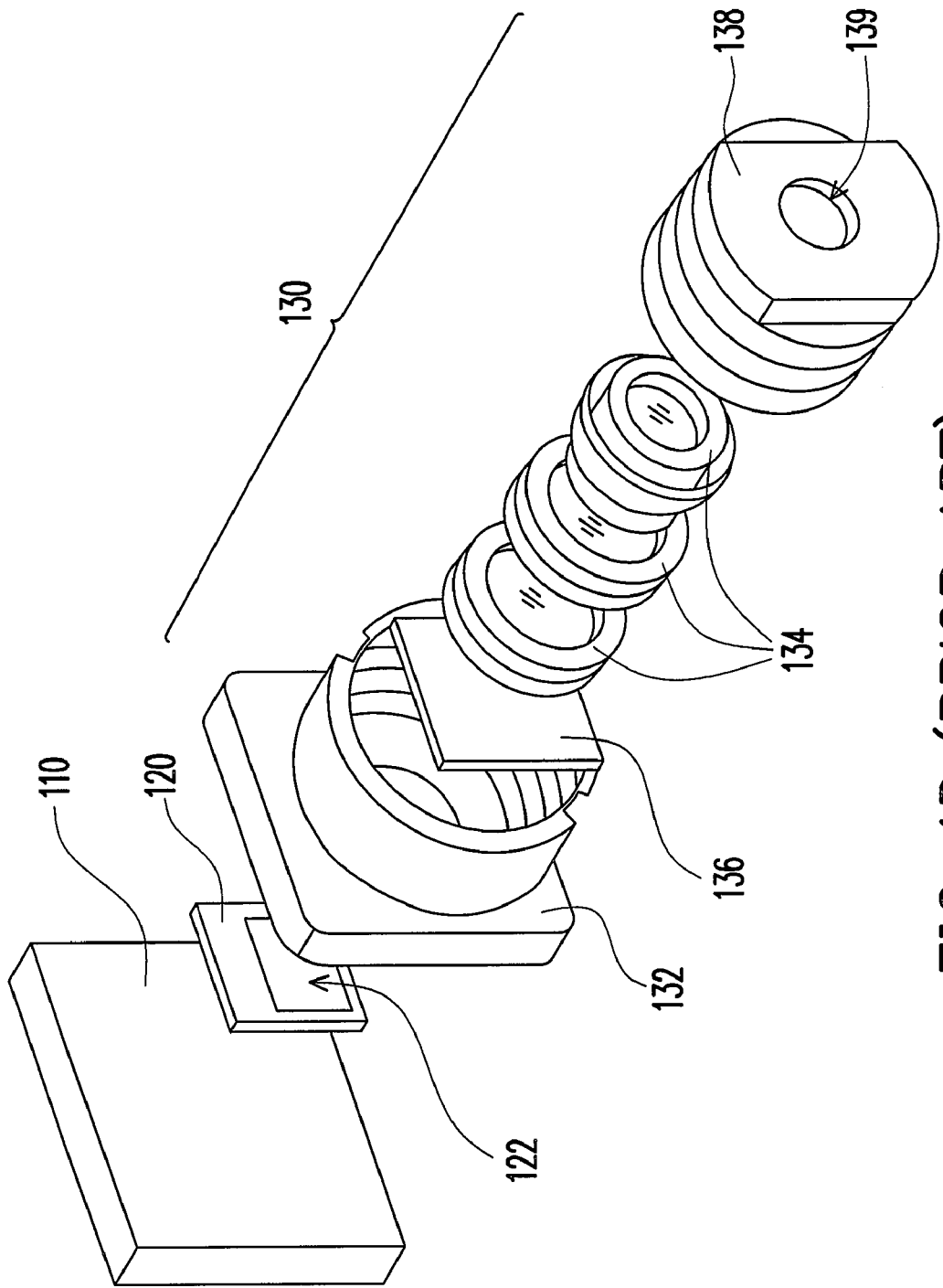
FIG. 1B is an explosion view showing the components of the CMOS image sensor in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

Figure 2:
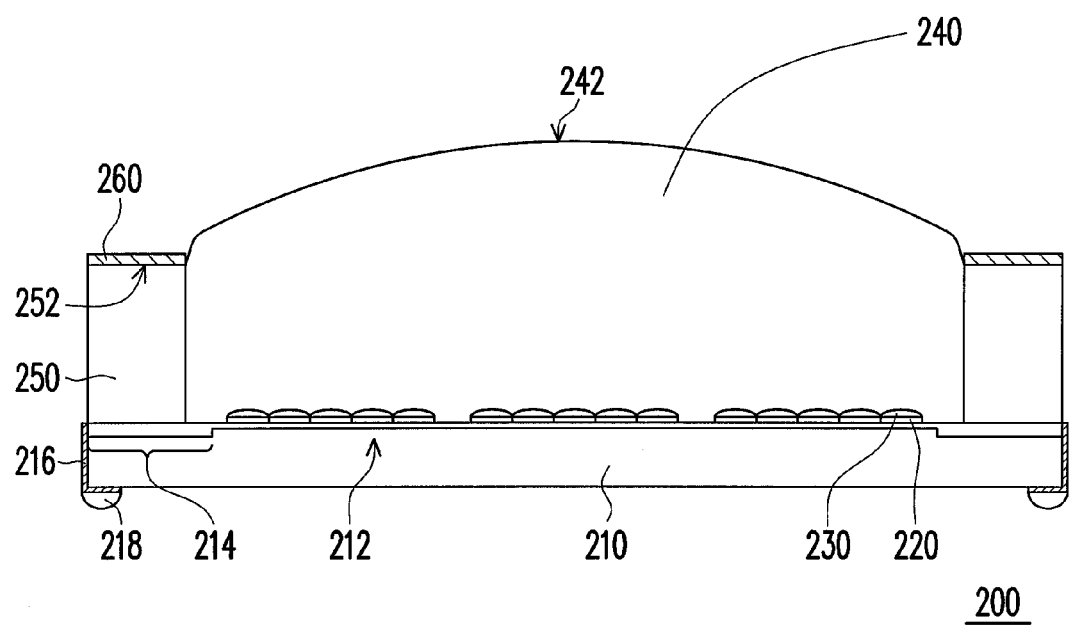
FIG. 2 is a schematic cross-sectional view of an image-sensing module according to one embodiment of the present invention.

FIG. 2 is a schematic cross-sectional view of an image-sensing module according to one embodiment of the present invention. As shown in FIG. 2, the image-sensing module 200 in the present embodiment includes a substrate 210, a plurality of image-sensing units 220, a plurality of micro lenses 230 and a focusing unit 240. The image-sensing units 220 are disposed on the substrate 210 and the micro lenses 230 are respectively disposed on one of the image-sensing units 220. The focusing unit 240 is disposed on the substrate 210 and covers the micro lenses 230. A top surface 242 of the focusing unit 240 is a curved surface.

The substrate 210 in the foregoing image-sensing module 200 is a circuit board 210, for example. The upper surface of the circuit board 210 has a sensing area 212 and a peripheral area 214 connected to the sensing area 212. The image-sensing units 220 are disposed inside the sensing area 212. A circuit layer 216 in the peripheral area 214 extends from the edge of the substrate 210 to the lower surface of the substrate 210. Furthermore, a plurality of solder balls 218 is disposed on the circuit layer 216 on the lower surface of the substrate 210 so that the substrate 210 can electrically connect with the devices of other electronic products through the solder balls 218. The focusing unit 230 is, for example, a lens formed on the substrate 210. The method of forming the lens includes performing a thermal curing process or a pressure molding process. The top surface 242 is, for example, a convex surface for concentrating external light rays. In other words, the focusing unit 240 and the micro lenses 230 in the present embodiment are able to focus light rays on the image-sensing units 220 so that the image-sensing units 220 can output electrical signals according to the sensed light rays. Moreover, the focusing unit 240 has a refractive index between 1 to 2, and preferably between 1.4 to 1.8. Besides a transparent material, the focusing unit 240 can be fabricated using an infrared filtering material to prevent overheating from affecting the performance of the image-sensing units 220 or damaging the image-sensing units 220.

The image-sensing module 200 may further includes an edge wall 250. The edge wall 250 is disposed on the peripheral area 214 of the substrate 210 and surrounding the image-sensing units 220 and the focusing unit 240. More specifically, the edge wall 250 is formed before forming the focusing unit 240 so that the edge wall 250 can be used as a barrier stopping the random flow of the fluidic material constituting the focusing unit 240 before it solidifies. In addition, a light-shielding layer 260 is disposed on a top surface 252 of the edge wall 250 to prevent strayed light rays from traveling to the image-sensing units 220 and to affect the sensing quality of the image-sensing module 200.

In the present embodiment, the focusing unit 240 is directly formed on the substrate 210. Since there is no need to assemble the focusing unit 240 to the substrate 210, considerable time is saved and productivity is increased. In addition, the focusing unit 240 has a simple structure, occupies a small volume and costs less to produce. Therefore, the design is able to reduce the volume of the image-sensing module 200 and lower its overall production cost.

In the present invention, the focusing unit can be a single lens or a stack of lenses. Descriptions of the focusing unit having a stack of lenses are described in the following embodiments along with relevant figures. However, these embodiments should not be use to limit the scope of the present invention.

Figure 3A:
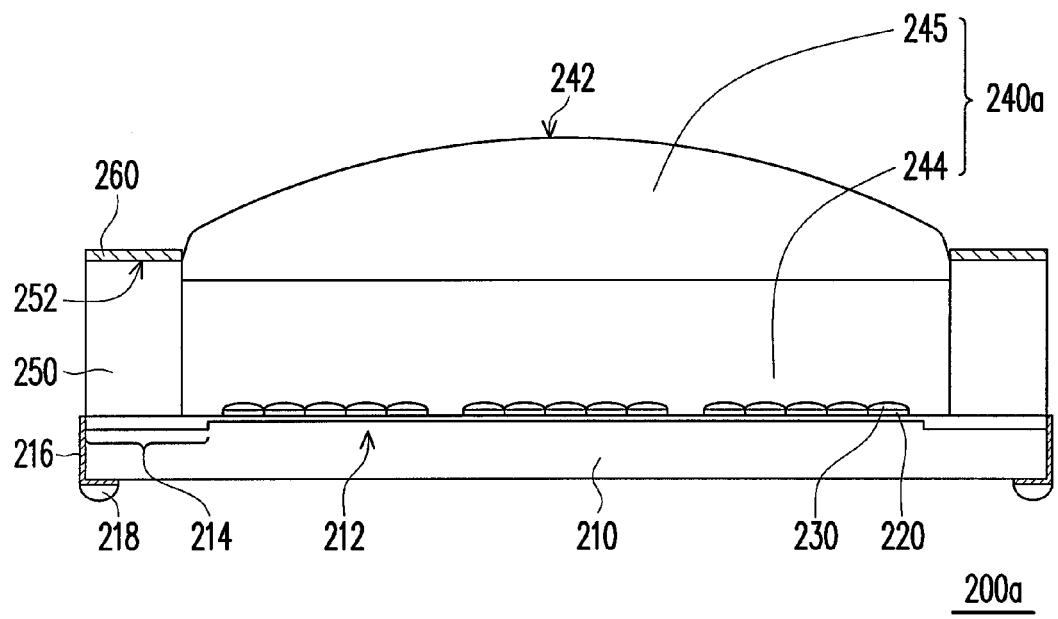
FIGS. 3A and 3B are schematic cross-sectional views of image-sensing modules according to another two embodiments of the present invention.
Figure 3B:
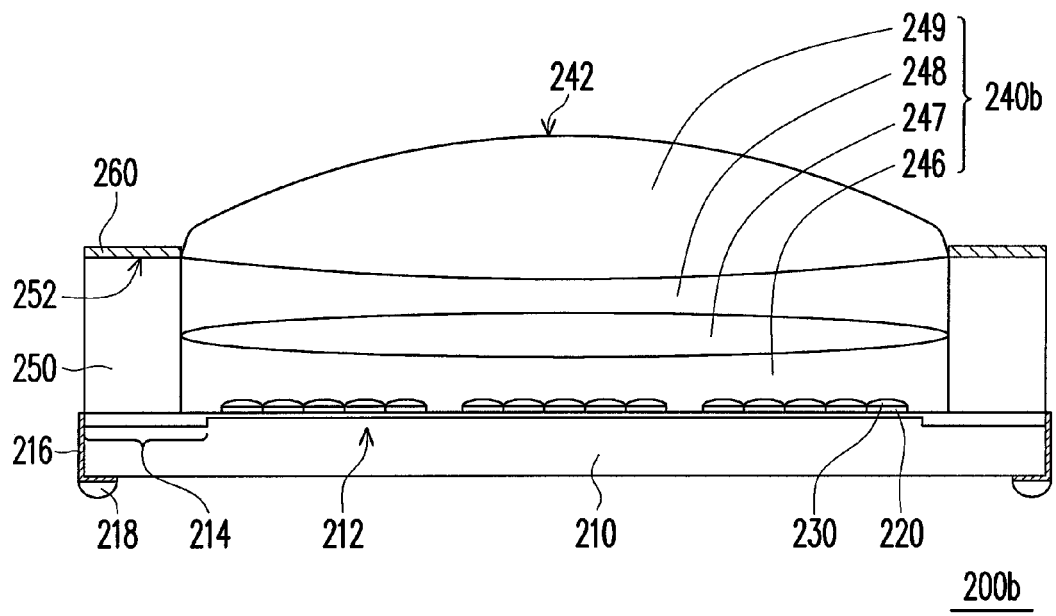

FIGS. 3A and 3B are schematic cross-sectional views of image-sensing modules according to another two embodiments of the present invention. First, as shown in FIG. 3A, the image-sensing module 200a in the present embodiment is similar to the image-sensing module 200 in FIG. 2. The only difference lies in the focusing unit. More specifically, the focusing unit 240a of the image-sensing module 200a includes a first lens 244 and a second lens 245. The first lens 244 is formed on the substrate 210 and the second lens 245 is formed on the first lens 244. The top surface of the first lens 244 is flat and the top surface of the second lens 245 (i.e. the top surface 242 of the focusing unit 240a) is a curved surface, for example. In addition, the lenses 244 and 245 have different refractive index. More specifically, if the refractive index of the first lens 244 is N1 and the refractive index of the second lens 245 is N2, then, $1<N1<N2<2$, preferably, $1.4<N1<N2<1.8$.

As shown in FIG. 3B, the focusing unit 240b of the image-sensing module 200b includes a stack of lenses 246, 247, 248, 249 on the substrate 210. The top surfaces of the lenses 246, 247, 248, 249 are curved surfaces and the refractive indexes of the lenses 246, 247, 248, 249 are all different. More specifically, the closer the lens is to the substrate 210, the higher the refractive index of the lens is. In other words, if the refractive indexes of the lenses 246, 247, 248 and 249 are respectively N1, N2, N3 and N4, then $N1<N2<N3<N4$. In addition, the refractive indexes of the lenses 246, 247, 248, 249 are, for example, between 1 to 2, preferably between 1.4 to 1.8.

It should be noted the focusing unit in the present invention is used together with the micro lenses to gather and direct the light rays to the image-sensing units. The shapes of the focusing units shown in FIGS. 2, 3A and 3B are used as examples only. The present invention provides no particular rules limiting the shape of the focusing unit. Therefore, after referring to the present invention, anyone skilled in this field may adjust the curvature of the lens surface of the focusing unit, choose the number of lenses to be used and select the refractive indexes of the lenses so that the focusing unit and the micro lenses can accurately direct incoming light rays to the image-sensing units.

Figure 4:
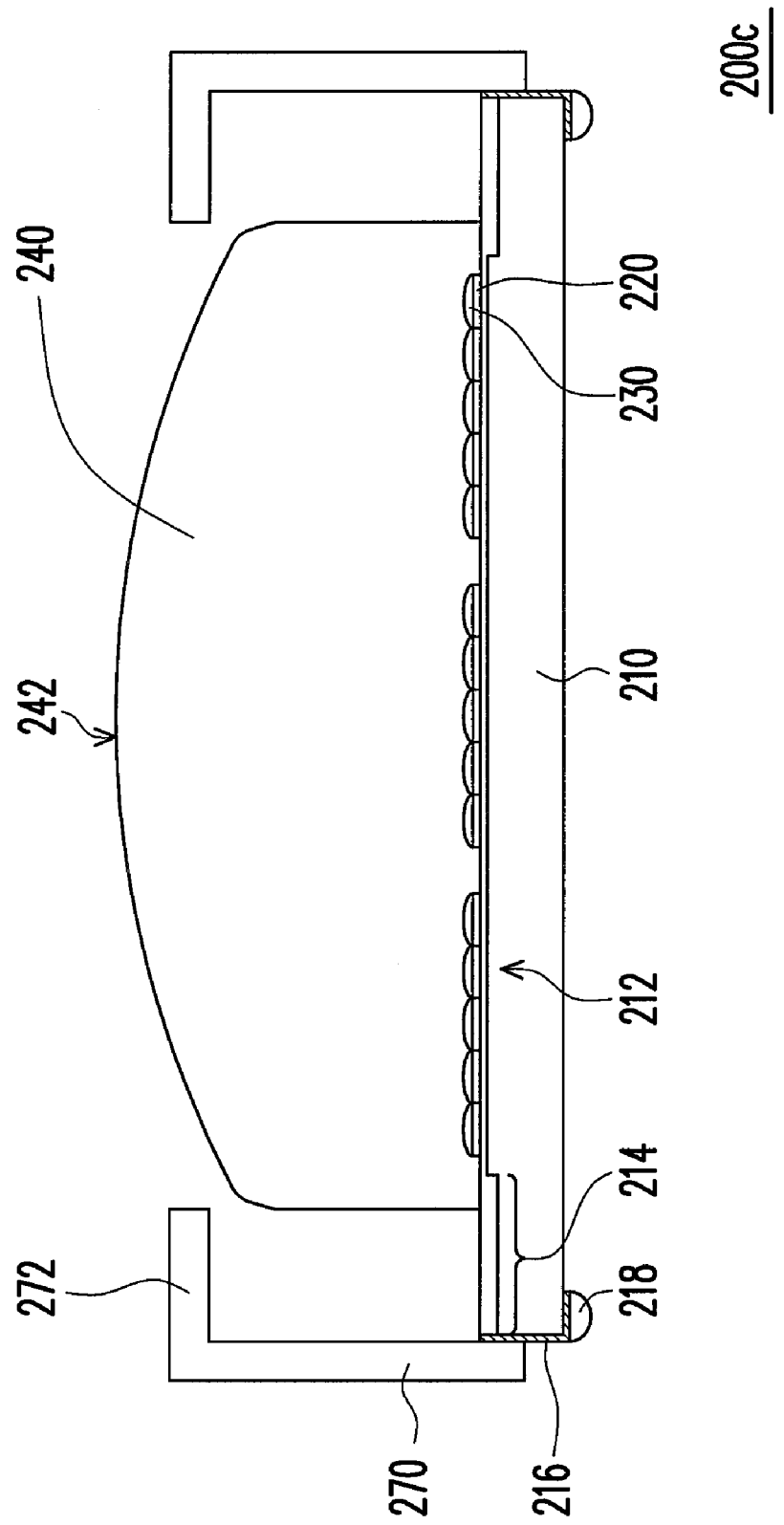
FIG. 4 is a schematic cross-sectional view of an image-sensing module according to another embodiment of the present invention.

FIG. 4 is a schematic cross-sectional view of an image-sensing module according to another embodiment of the present invention. As shown in FIG. 4, the image-sensing module 200c is similar to the image-sensing module 200 in FIG. 2. In the following, only their differences are described. In the image-sensing module 200c, the method of forming the focusing unit 240 includes, for example, performing a pressure molding process. Therefore, there is no need to use the edge wall 250 in FIG. 2 as a barrier to stop the random flow of material constituting the focusing unit 240 before it solidifies. In addition, the image-sensing module 200c further includes a frame 270 connected to the edge of the substrate 210 and surrounding the substrate 210 and the focusing unit 240. The frame 270 has a light-shielding section 272 extending toward the top surface 242 of the focusing unit 240 to prevent strayed light rays from traveling to the image-sensing units 220 and affecting the sensing quality of the image-sensing module 200c. Furthermore, a transparent material layer (not shown) may fill up the space between the frame 270 and the focusing unit 240 and the transparent material layer may have a refractive index substantially equivalent to the refractive index of air.

Figure 5:
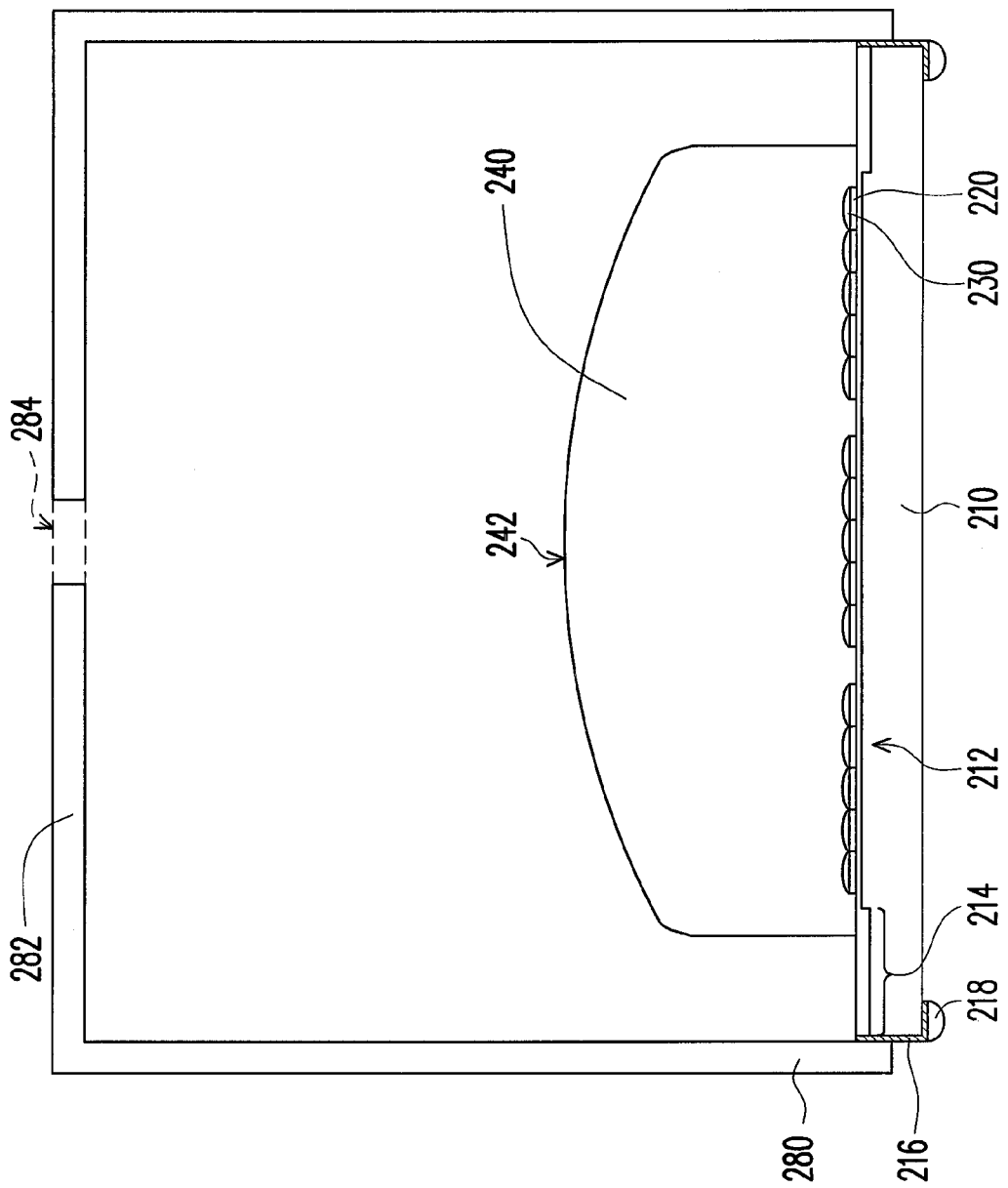
FIG. 5 is a schematic cross-sectional view of an image-sensing module according to yet another embodiment of the present invention.

FIG. 5 is a schematic cross-sectional view of an image-sensing module according to yet another embodiment of the present invention. As shown in FIG. 5, the image-sensing module 200d in the present embodiment is similar to the image-sensing module 200c in FIG. 4. The main difference is that the frame 280 in the image-sensing module 200d is connected to the edge of the substrate 210 and surrounds the substrate 210. Furthermore, the frame 280 has a top section 282 above the focusing unit 240 and blocking the focusing unit 240. The top section 282 has an image-forming pinhole 284 that allows the passage of external light rays to the focusing unit 240.

Figure 6:
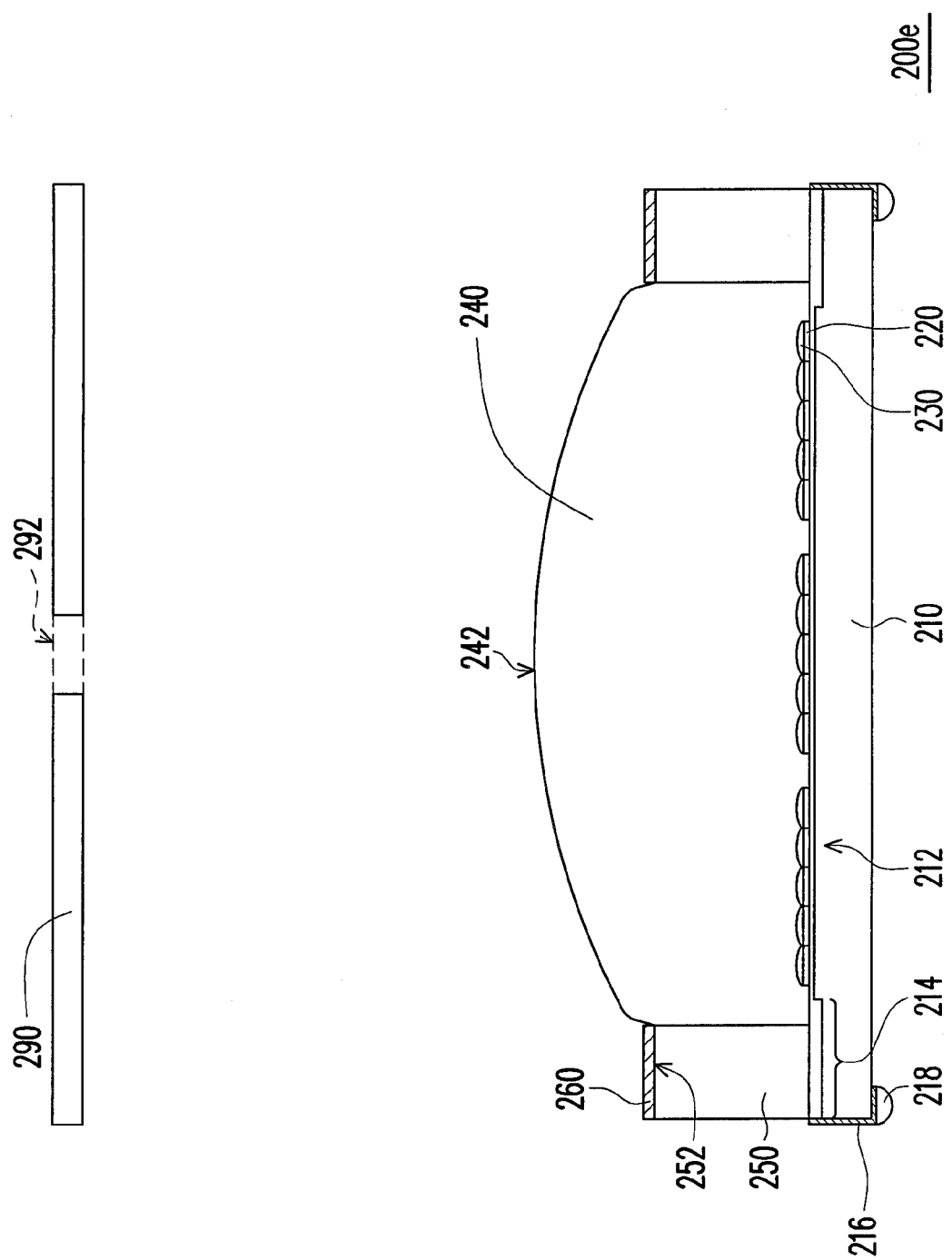
FIGS. 6, 6A, 6B are a schematic cross-sectional views of an image-sensing module according to another embodiment of the present invention.

FIG. 6 is a schematic cross-sectional view of an image-sensing module according to another embodiment of the present invention. As shown in FIG. 6, compared with the image-sensing module 200 in FIG. 2, the image-sensing module 200e in the present embodiment further includes a light-shielding element 290 disposed over the focusing unit 240 to block the focusing unit 240. The light-shielding element 290 has an image-forming pinhole 292 that allows the passage of external light rays to the focusing unit 240. It should be noted that the light-shielding element can be similarly applied to the image-sensing modules 200a~200c in FIGS. 3A through 4. More specifically, the light-shielding element 290 can be disposed over the focusing unit 240a of the image-sensing module 200a, over the focusing unit 240b of the image-sensing module 200b or over the focusing unit 240 of the image-sensing module 200c.

Figure 7:
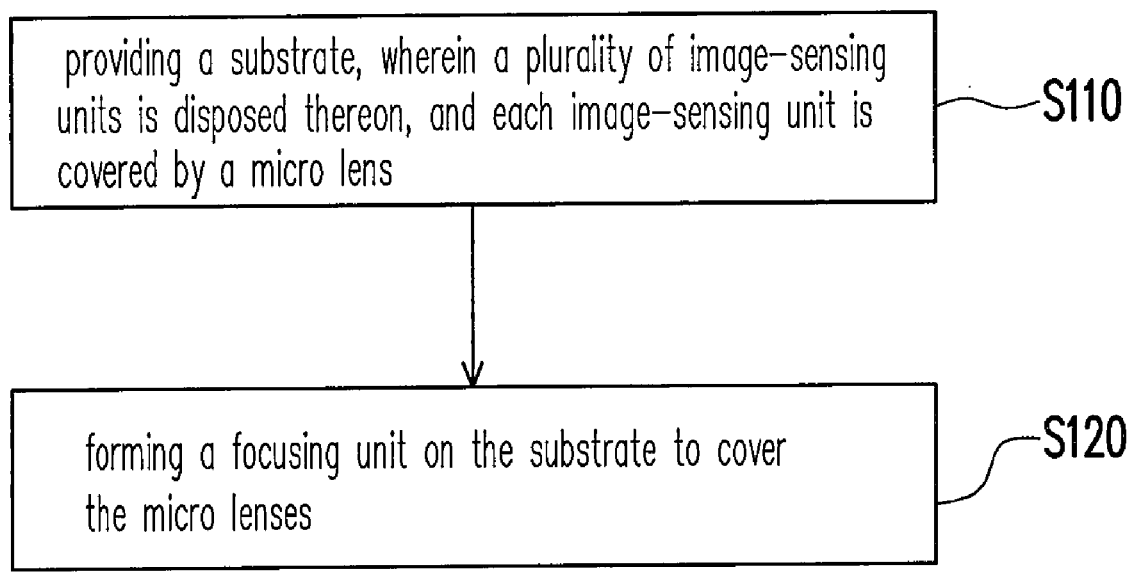
FIG. 7 is a flow diagram showing the steps for manufacturing an image-sensing module according to one embodiment of the present invention.

In the following, a method of manufacturing the image-sensing module is described. FIG. 7 is a flow diagram showing the steps for manufacturing an image-sensing module according to one embodiment of the present invention. As shown in FIGS. 2 and 7, a substrate 210 is provided in step S10. Image-sensing units 220 are set up on the substrate 210 and micro lenses 230 cover the respective image-sensing units 220.

Then, a focusing unit 240 is formed over the substrate 210 to cover the micro lenses 230 in step S120. The top surface 242 of the focusing unit 240 is a curved surface. More specifically, the focusing unit 240 in the present embodiment is, for example, a lens formed on the substrate 210. The method of forming the lens includes performing a thermal curing process or a pressure molding process. If the lens is formed in a thermal curing process, there is a need to form an edge wall 250 on the substrate 210 to surround the image-sensing units 220 first. After that, the area enclosed by the edge wall 250 is filled with the material for forming the lens. Meanwhile, the edge wall 250 serves as a barrier preventing the lens material from flowing randomly before it solidifies. Thereafter, a thermal curing process is performed to cure the lens material into any required shape. In the present embodiment, a light-shielding layer 260 may be formed on the top surface 252 of the edge wall 250 to prevent strayed light rays from traveling to the image-sensing units 220.

Furthermore, as shown in FIG. 4, when the focusing unit 240 is formed in a pressure molding process, there is no need to form the edge wall 250 on the substrate 210. Moreover, after forming the focusing unit 240, the frame 270 may be connected to the edge of the substrate 210.

In the present embodiment, thermal curing process or pressure molding process may be performed to form a stack of lenses on the substrate 210 serving as a focusing unit (for example, the focusing units 240a and 240b shown in FIGS. 3A and 3B).

As shown in FIG. 5, after performing the thermal curing process or the pressure molding process to form the focusing unit 240, the frame 280 may be connected to the edge of the substrate 210 and surrounds the substrate 210. Moreover, the frame 280 in the present embodiment may also be connected to the substrate 210 shown in FIGS. 2 through 3B.

Figure 6A:
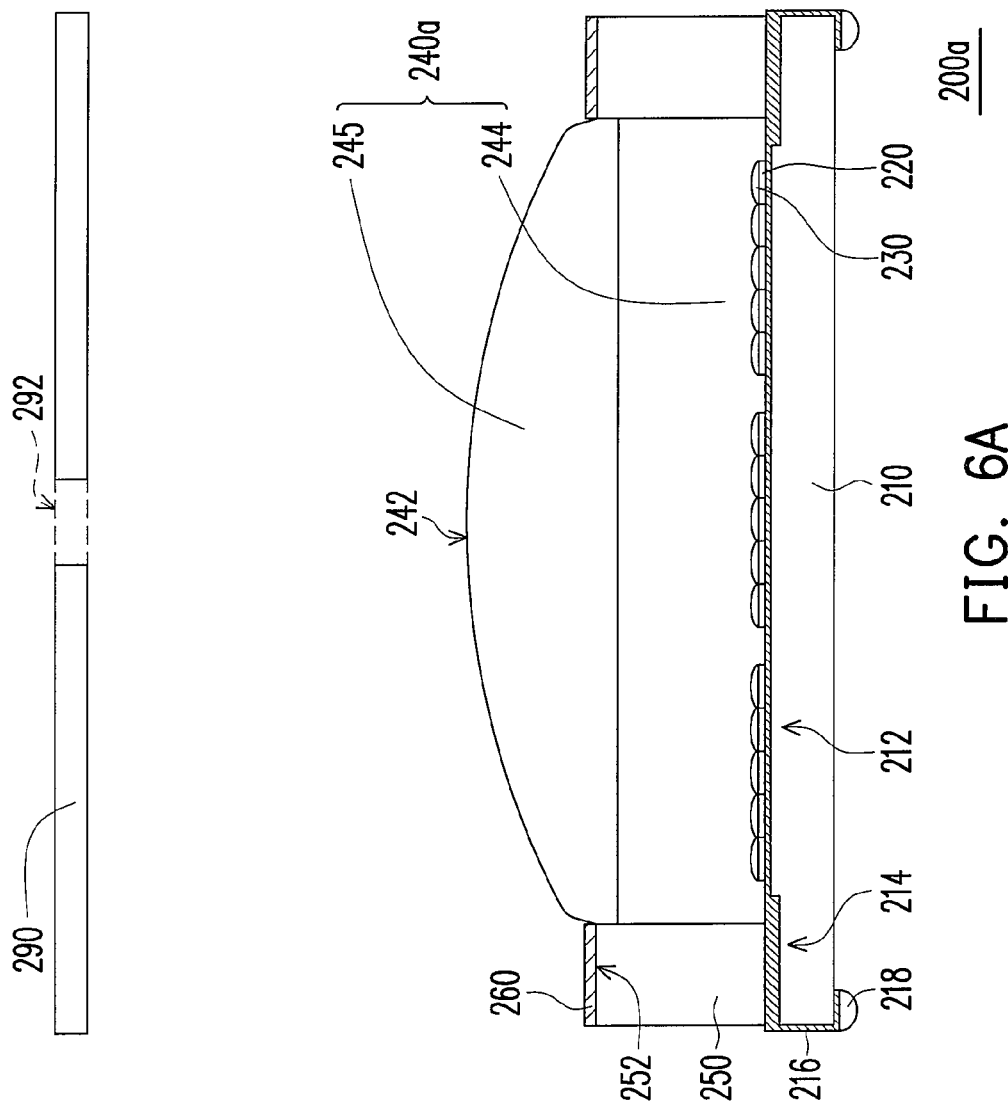
Figure 6B:
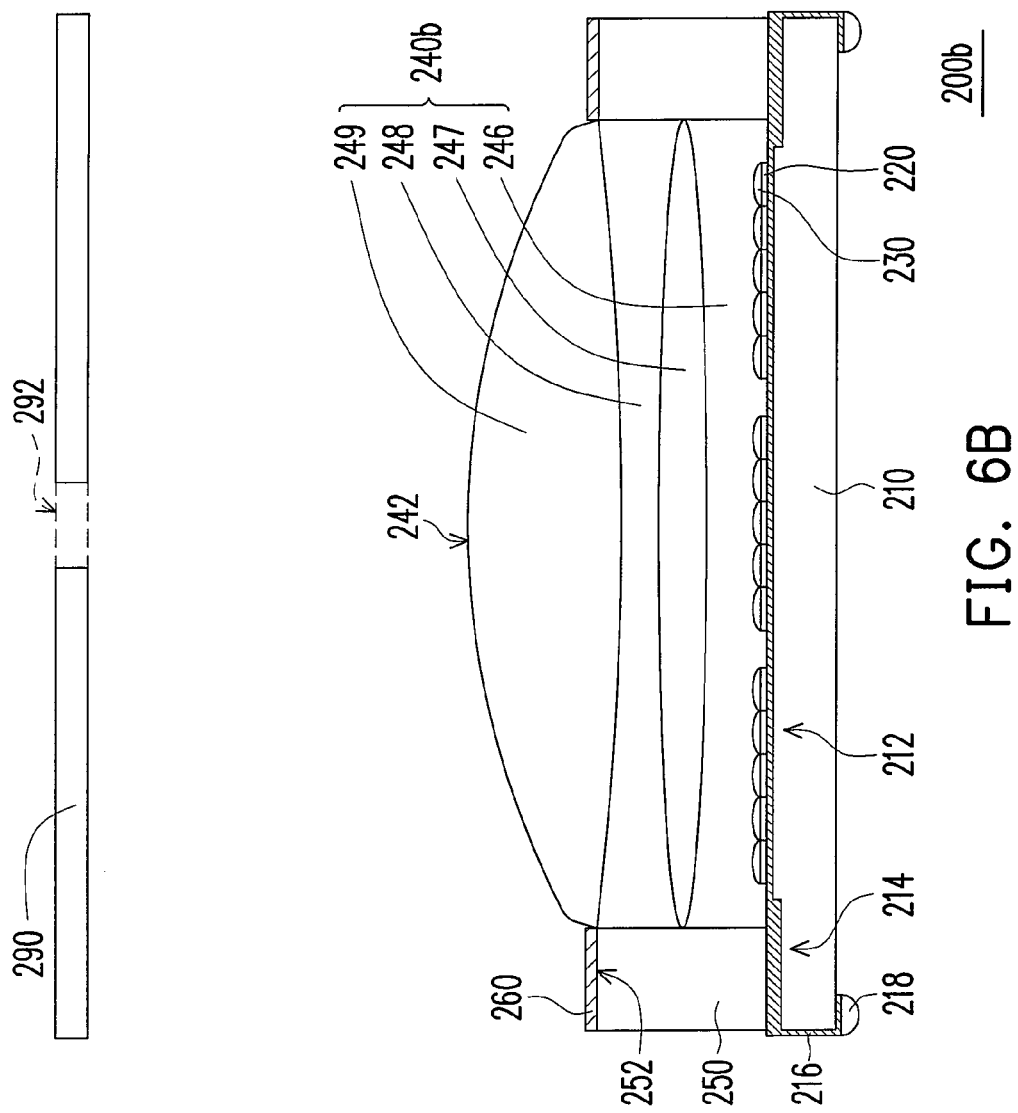

As shown in FIGS. 6, 6A, 6B, after performing the thermal curing process or the pressure molding process to form the focusing unit 240, the light-shielding element 290 may be disposed over the focusing unit 240. Moreover, the light-shielding element 290 in the present embodiment may also be disposed over the focusing units 240, 240a and 240b shown in FIGS. 3A through 4.

Figure 8A:
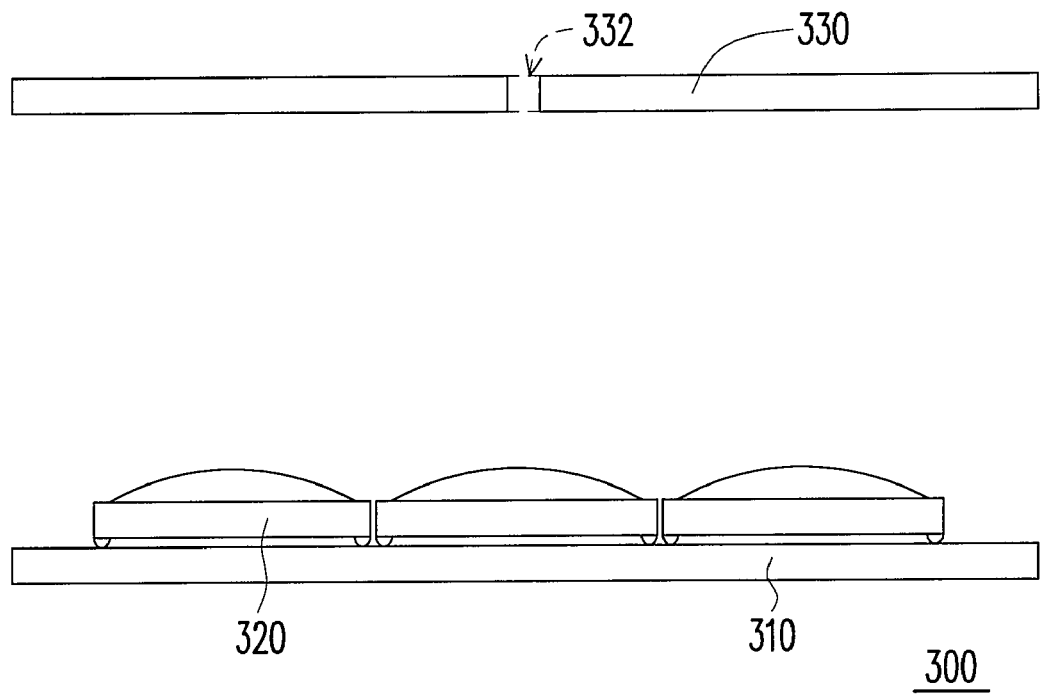
FIG. 8A is a sketch of an image capture apparatus according to one embodiment of the present invention.
Figure 8B:
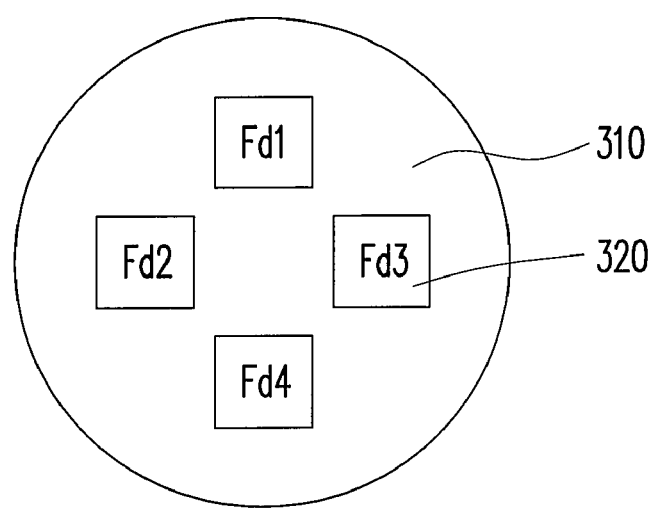
FIG. 8B is a top view of the base and the image-sensing modules in FIG. 8A.

FIG. 8A is a sketch of an image capture apparatus according to one embodiment of the present invention. FIG. 8B is a top view of the base and the image-sensing modules in FIG. 8A. As shown in FIGS. 8A and 8B, the image capture apparatus 300 includes a base 310, at least an image-sensing module 320 and a light-shielding element 330. The light-shielding element 330 is disposed above the image-sensing module 320 and has an image-forming pinhole 332 that allows the passage of external light rays to the image-sensing module 30 opposite to the pinhole 332. In the present embodiment, the image-sensing module 332 can be one of the image-sensing modules 200 through 200c shown in FIGS. 2 through 4.

It should be noted that, when the image capture apparatus 300 comprises multiple image-sensing modules, the focusing units of the image-sensing modules have different focal distance, for example, $Fd_1$, $Fd_2$, $Fd_3$, $Fd_4$, as shown in FIG. 8b. Moreover, the base 310 is a movable base. More specifically, the base 310 is a turntable, for example. The base 310 is suitable for switching the image-sensing modules 320 so that only one of the image-sensing modules 320 is opposite to the pinhole 332. More specifically, because the focal distance of the focusing unit in each image-sensing module 320 is different, the base 310 can be utilized to switch the image-sensing module 320 opposite to the pinhole 332. Hence, the zoom function is achieved.

In summary, the image-sensing module and manufacturing method thereof and image capture apparatus of the present invention has at least the following advantages:

1. The focusing unit has a simple structure, occupies a small volume and costs less to produce. Therefore, the image-sensing module is less bulky and the production cost is lower.
2. In the manufacturing of the image-sensing module, the focusing unit is directly formed on the substrate. Hence, the time for assembling the focusing unit and the substrate together is saved and the productivity is increased.
3. Since the focal distance of the focusing unit of each image-sensing module inside the image capture apparatus is different, the base can be utilized to switch the locations of the image-sensing modules to achieve zoom function.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image-sensing module, comprising:
   a substrate;
   a plurality of image-sensing units, disposed on the substrate;
   a plurality of micro lenses, each respectively disposed directly on one of the plurality image-sensing units; and
   a focusing unit, disposed directly on the substrate and covering the micro lenses, the focusing unit comprising at least one lens configured directly on and in contact with the micro lenses, wherein a top surface of the focusing unit is a curved surface.

2. The image-sensing module as claimed in claim 1, wherein the focusing unit comprises a lens.

3. The image-sensing module as claimed in claim 2, wherein the lens has a refractive index between 1 and 2.

4. The image-sensing module as claimed in claim 2, wherein the lens has a refractive index between 1.4 and 1.8.

5. The image-sensing module as claimed in claim 1, wherein the focusing unit comprises a stack of lenses on the substrate.

6. The image-sensing module as claimed in claim 5, wherein the lenses have different refractive indexes.

7. The image-sensing module as claimed in claim 6, wherein the lens closer to the substrate has a larger refractive index.

8. The image-sensing module as claimed in claim 1, further comprising an edge wall disposed on the substrate and surrounding the image-sensing units, and the focusing unit is located within the area enclosed by the edge wall.

9. The image-sensing module as claimed in claim 8, further comprising a light-shielding layer disposed on a top surface of the edge wall.

10. The image-sensing module as claimed in claim 1, further comprising a frame connected to the edge of the substrate and surrounding the substrate and the focusing unit such that the frame has a light-shielding section extending toward the top surface of the focusing unit.

11. The image-sensing module as claimed in claim 1, further comprising a frame connected to the edge of the substrate and surrounding the substrate, wherein the frame has a top section above the focusing unit and blocking the focusing unit, and the top section has a pinhole that allows the passage of external light rays to the focusing unit.

12. The image-sensing module as claimed in claim 1, further comprising a light-shielding element disposed above the focusing unit for blocking the focusing unit, wherein the light-shielding element has a pinhole that allows the passage of external light rays to the focusing unit.

13. A method of manufacturing an image-sensing module, comprising:
   providing a substrate, wherein a plurality of image-sensing units is disposed thereon, and each image-sensing unit is directly covered by a micro lens; and
   forming a focusing unit directly on the substrate to cover the micro lenses, the focusing unit comprising at least one lens configured directly on and in contact with the micro lenses, wherein a top surface of the focusing unit is a curved surface.

14. The method as claimed in claim 13, wherein the method of forming the focusing unit comprises forming a lens on the substrate.

15. The method as claimed in claim 14, wherein the method of forming the lens comprises performing a thermal curing process or a pressure molding process.

16. The method as claimed in claim 13, wherein the method of forming the focusing unit comprises forming a plurality of lenses in sequence, and the lenses are stacked on the substrate.

17. The method as claimed in claim 16, wherein the method of forming each lens comprises performing a thermal curing process or a pressure molding process.

18. The method as claimed in claim 16, further comprising forming an edge wall that surrounds the image-sensing units on the substrate before forming the focusing unit, and the focusing unit is formed within the area enclosed by the edge wall.

19. The method as claimed in claim 18, further comprising forming a light-shielding layer on a top surface of the edge wall.

20. The method as claimed in claim 13, further comprising connecting a frame to the edge of the substrate, wherein the frame surrounds the substrate and the focusing unit, and the frame has a light-shielding section extending toward the top surface of the focusing unit.

21. The method as claimed in claim 13, further comprising connecting a frame to the edge of the substrate, wherein the frame surrounding the substrate has a top section above the focusing unit and blocking the focusing unit, and the top section has a pinhole that allows the passage of external light rays to the focusing unit.

22. The method as claimed in claim 13, further comprising disposing a light-shielding element over the focusing unit to block the focusing unit, wherein the light-shielding element has a pinhole that allows the passage of external light rays to the focusing unit.

23. An image capture apparatus, comprising:
a base;
at least an image-sensing module disposed on the base, wherein the image-sensing module comprises:
  a substrate;
  a plurality of image-sensing units, disposed on the substrate;
  a plurality of micro lenses, each respectively disposed directly on one of the plurality of image-sensing units;
  a focusing unit, disposed directly on the substrate and covering the micro lenses, the focusing unit comprising at least one lens configured directly on and in contact with the micro lenses, wherein a top surface of the focusing unit is a curved surface; and
a light-shielding element, disposed above the image-sensing module, wherein the light-shielding element has a pinhole that allows the passage of external light rays to the focusing unit.

24. The image capture apparatus as claimed in claim 23, wherein the focusing unit comprises a lens.

25. The image capture apparatus as claimed in claim 24, wherein the lens has a refractive index between 1 and 2.

26. The image capture apparatus as claimed in claim 24, wherein the lens has a refractive index between 1.4 and 1.8.

27. The image capture apparatus as claimed in claim 23, wherein the focusing unit comprises a stack of lenses on the substrate, wherein the stacked of lenses are in full contact with each other.

28. The image capture apparatus as claimed in claim 27, wherein the lenses have different refractive indexes.

29. The image capture apparatus as claimed in claim 28, wherein the lens closer to the substrate has a larger refractive index.

30. The image capture apparatus as claimed in claim 23, wherein the image-sensing module further comprises an edge wall disposed on the substrate and surrounding the image-sensing units, and the focusing unit is located within the area enclosed by the edge wall.

31. The image capture apparatus as claimed in claim 30, wherein the image-sensing module further comprises a light-shielding layer disposed on a top surface of the edge wall.

32. The image capture apparatus as claimed in claim 23, wherein the image-sensing module further comprises a frame connected to the edge of the substrate and surrounding the substrate and the focusing unit, wherein the frame comprises the light-shielding element extending toward the top surface of the focusing unit.

33. The image capture apparatus as claimed in claim 23, comprising a plurality of image-sensing modules and the focal distance of the focusing unit in each image-sensing module is different.

34. The image capture apparatus as claimed in claim 33, wherein the base is a movable base suitable for switching the locations of the image-sensing modules so that one of the image-sensing modules is opposite to the pinhole.

35. The image capture apparatus as claimed in claim 34, wherein the base is a turntable.

* * * * *